(12) United States Patent
Hsu et al.

(10) Patent No.: US 10,643,879 B2
(45) Date of Patent: May 5, 2020

(54) TRANSFER HEAD FOR TRANSFERRING MICRO ELEMENT AND TRANSFERRING METHOD OF MICRO ELEMENT

(71) Applicant: XIAMEN SANAN OPTOELECTRONICS TECHNOLOGY CO., LTD., Xiamen (CN)

(72) Inventors: Chen-ke Hsu, Xiamen (CN); Xiaojuan Shao, Xiamen (CN); Jiansen Zheng, Xiamen (CN); Junpeng Shi, Xiamen (CN); Kechuang Lin, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/859,729

(22) Filed: Jan. 1, 2018

(65) Prior Publication Data
US 2018/0122683 A1 May 3, 2018

Related U.S. Application Data

(63) Continuation of application No. PCT/CN2016/104867, filed on Nov. 7, 2016.

(30) Foreign Application Priority Data

Sep. 30, 2016 (CN) .......................... 2016 1 0865697

(51) Int. Cl.
*H01L 21/683* (2006.01)
*B25J 15/06* (2006.01)
*H01L 33/00* (2010.01)

(52) U.S. Cl.
CPC ...... *H01L 21/6838* (2013.01); *B25J 15/0625* (2013.01); *H01L 21/6835* (2013.01); *H01L 33/00* (2013.01); *H01L 33/0095* (2013.01)

(58) Field of Classification Search
CPC . H01L 21/6838; H01L 33/00; H01L 21/6835; B25J 15/0625
(Continued)

(56) References Cited

U.S. PATENT DOCUMENTS 4,674,785 A * 6/1987 Riesenberg ........... B25B 11/005
294/186
6,394,760 B1 * 5/2002 Tell ......................... F04F 5/467
417/174

(Continued)

*Primary Examiner* — Paul T Chin
(74) *Attorney, Agent, or Firm* — Syncoda LLC; Feng Ma

(57) ABSTRACT

A transfer head for transferring micro element includes a cavity; a plurality of vacuum paths connected with the cavity respectively with valves configured at the connection between the cavity and the vacuum paths and used for opening/closing; a plurality of suction nozzles connected with the vacuum paths, wherein the suction nozzles hold or release the micro element via vacuum pressure; vacuum pressure is transmitted by each vacuum path; a switching component for controlling valve to open/close each vacuum path, so as to control the suction nozzles to hold or release required micro element via vacuum pressure. Further, the switching component includes a CMOS memory circuit and an address electrode array connected to the CMOS memory circuit to realize micro-switch array. The transfer head can selectively transfer a plurality of micro elements at one time.

19 Claims, 14 Drawing Sheets

(58) Field of Classification Search
USPC .................................................. 294/183, 185
See application file for complete search history.

(56) References Cited

U.S. PATENT DOCUMENTS

| | | | | |
|---|---|---|---|---|
| 2005/0062302 A1* | 3/2005 | Gieskes | ............. | H05K 13/0409 294/64.2 |
| 2006/0119118 A1* | 6/2006 | Hata | .................. | H05K 13/0409 294/183 |
| 2006/0138793 A1* | 6/2006 | Tanae | ..................... | B65G 47/91 294/64.3 |
| 2007/0148009 A1* | 6/2007 | Cho | ........................ | F04F 5/467 417/174 |
| 2008/0145190 A1* | 6/2008 | Yassour | .................. | H01L 21/00 414/147 |
| 2011/0254298 A1* | 10/2011 | Lomerson, Jr. | ...... | B25J 15/0616 294/65 |
| 2018/0158706 A1* | 6/2018 | Hsu | ........................ | H01L 24/00 |

* cited by examiner

TRANSFER HEAD FOR TRANSFERRING MICRO ELEMENT AND TRANSFERRING METHOD OF MICRO ELEMENT

CROSS-REFERENCE TO RELATED APPLICATIONS

The present application is a continuation of, and claims priority to, PCT/CN2016/104867 filed on Nov. 7, 2016, which claims priority to Chinese Patent Application No. 201610865697.8 filed on Sep. 30, 2016. The disclosures of these applications are hereby incorporated by reference in their entirety.

BACKGROUND

Micro element technologies involve integrating micro-size element arrays in high density over a substrate. At present, micro light-emitting diode (Micro LED) technology is becoming a hot research topic, and the industry circle expects high-quality micro element products in the market. High-quality micro light-emitting diode products have profound impacts on conventional display products in the market, such as liquid crystal display (LCD) and organic light-emitting diode (OLED).

SUMMARY

The inventors of the present disclosure have recognized that, during fabrication of the micro element, at first, a micro element is formed over a donor substrate, and then the micro element is transferred to an acceptor substrate. For example, the acceptor substrate is a display screen. One difficulty during micro element fabrication is: how to transfer the micro element from the donor substrate to the acceptor substrate.

In conventional micro element transfer, the micro element is transferred to the acceptor substrate through a transfer substrate via wafer bonding. Direct transfer is a kind of method by directly bonding the micro element array to the acceptor substrate from the transfer substrate, and then removing the transfer substrate. Indirect transfer is the other method. This method includes two times of bonding/lifting-off steps. At first, the transfer substrate extracts the micro element array from the donor substrate, and bonds the micro element array to the acceptor substrate. Finally, remove the transfer substrate. The micro element array is generally extracted by electrostatic method. During electrostatic extraction, a transfer head array is required. The transfer head array is of complex structure, and the reliability is a factor to consider. The fabrication of transfer head array brings additional cost. Before extraction with the transfer head array, phase change is required. In addition, during fabrication of the transfer head array, thermal budget of the micro element for phase change is limited, which is generally lower than 350° C., or specifically, lower than 200° C.; otherwise, the micro element performance will be degraded.

To solve the above problems, the present disclosure provides a transfer head for transferring the micro element and a transferring method for transferring the micro element.

According to a first aspect of the present disclosure, a transfer head for transferring the micro element includes a cavity; a plurality of vacuum paths connected with the cavity respectively; valves configured at the connection between the cavity and the vacuum paths and used for opening/closing; a plurality of suction nozzles, which are connected with the vacuum paths, wherein, the suction nozzles attract (e.g., hold) or release the micro element via vacuum pressure; vacuum pressure is transmitted by each vacuum path; a switching component for controlling valve to open/close each vacuum path, so as to control the suction nozzles to hold or release required micro element via vacuum pressure.

In some embodiments, the switching component includes a complementary metal-oxide-semiconductor (CMOS) memory circuit and an address electrode array connected to the CMOS memory circuit, wherein, each vacuum path valve corresponds to the address electrode array.

In some embodiments, the valve has a movable component, wherein, the address electrode array is under selective excitation by the CMOS memory circuit with voltage potential to generate electrostatic attraction, through which, corresponding movable element would deflect or approach to corresponding address electrode, thus controlling opening or closing of each vacuum path.

In some embodiments, the movable components are at the bottom of the address electrode array, and are separated from each other, wherein, a space is between them so that the movable component can deflect or approach to corresponding address electrode under electrostatic attraction.

In some embodiments, a space is formed between the address electrode and the movable component with a sacrificial layer so that the movable component would deflect or approach to corresponding address electrode under electrostatic attraction.

In some embodiments, the transfer head also includes a substrate with two opposite surfaces, wherein, the first surface is adjacent to the cavity, and the second surface is far from the cavity; and the vacuum paths are a series of micropores passing through the substrate, wherein, one end is connected to the cavity, and the other end is connected to the suction nozzles.

In some embodiments, a connection part between the first surface of the substrate and the micropore has a third surface lower than the first surface; wherein, the movable component is arranged over the first surface of the substrate and crosses the micropore; one end of the movable component is in a corresponding position over the third surface of the substrate and is suspended, so that this end of the movable component can deflect towards the address electrode under electrostatic attraction to close or open corresponding vacuum path.

In some embodiments, a step is configured at the connection position between the first surface of the substrate and the micropore; wherein, a surface of the step is lower than the first surface; the surface has a same width as that of the micropore.

In some embodiments, the movable component is arranged over the first surface of the substrate; wherein, at least one end is fixed on the first surface of the substrate, and extends towards the micropore to cover the opening of the micropore, and one end of the movable component deflects towards the address electrode under electrostatic attraction.

In some embodiments, the first surface of the substrate is provided with a metal layer, which is fabricated to a metal sheet as the movable component at corresponding position of the micropore of the substrate; wherein, at least one end of the metal sheet is connected to the metal layer, and the other end is separated from the metal layer, which can deflect towards the address electrode under electrostatic attraction.

In some embodiments, a first end of the movable component is fixed on the first surface of the substrate, and a second end at the opposite angle of the first end is at the bottom of corresponding address electrode, which deflects towards the address electrode under electrostatic attraction.

In some embodiments, the movable component is fixed over the first surface of the substrate via a pivotal structure, and deflects towards corresponding address electrode under electrostatic attraction taking this pivot as the center.

In some embodiments, the substrate is a Si substrate, a ceramic substrate, a metal substrate, a sapphire substrate or a semiconductor material substrate.

In some embodiments, the suction nozzles size is below 100 μm.

In some embodiments, the micropore structure is formed by laser boring, micro-perforation techniques (TSV) or wiring.

In some embodiments, suction nozzles are distributed in an array, wherein, space between suction nozzles is below 200 μm.

In some embodiments, the micropore section is trapezoid or rectangle.

According to a second aspect of the present disclosure, a transfer method for the micro elements includes: (1) placing at least one micro element over the first substrate; (2) orienting and contacting the micro element by an aforementioned transfer head; wherein, the suction nozzle holds the micro element via vacuum pressure, and the switching component controls the opening and closing of each vacuum path valve so as to extract required micro element; and (3) orienting the transfer head with extracted micro element towards the second substrate, wherein, the suction nozzle releases the micro element via vacuum pressure, and the switching component controls the opening and closing of each vacuum path valve so as to release the extracted micro element over the second substrate. In some embodiments, a plurality of micro elements are provided, wherein, in step (2), only part of the micro elements are held to extract required micro elements.

In some embodiments, a plurality of micro elements are provided, wherein, in step (3), only part of the micro elements are desorbed to release required micro element.

In some embodiments, the first substrate is a growth substrate or a carrier substrate.

In some embodiments, the second substrate is an active element array substrate or a passive element array substrate.

The present disclosure provides a transfer head with a plurality of suction nozzles, wherein, each suction nozzle is connected to a same cavity and controls opening/closing of each vacuum path via a switching component so as to realize selective transferring of a plurality of micro elements at one time. Further, the switching component can be a CMOS memory circuit and an address electrode array connected to the CMOS memory circuit to realize micro-switch array.

In addition, it should be understood by those skilled in the art that despite many problems in the prior art, the technical scheme of each embodiment or claim of the present disclosure can be improved in one or several aspects. It is not necessary to solve all technical problems listed in the prior art or the background art. It should be understood by those skilled in the art that contents not mentioned in a claim shall not be construed as limiting the claim.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

DETAILED DESCRIPTION

Various embodiments of the present disclosure provide a transfer head for transferring the micro element and the element array transferring method with this transfer head. The micro element array can be a micro LED device, a diode, a transistor, an integrated chip (IC), with size of 1-100 µm, which is not limited to this size. In addition, some aspects of the embodiment may apply to larger or smaller sizes.

The embodiments below disclose a transfer head with suction nozzle arrays, wherein, each suction nozzle is connected to a same cavity via a vacuum path, and each vacuum path has a switching component to control opening/closing of the vacuum path. Size of each suction nozzle (for example length or width) is 1-100 µm. In one embodiment, size of each suction nozzle is 1-20 µm. In one embodiment, pitch of the suction nozzle array is (1 µm~100 µm)×(1 µm~100 µm), for instance, 10 µm×10 µm or 50 µm×100 µm. To achieve this size, each vacuum path can be a series of micropores formed over a substrate (for example Si substrate). Correspondingly, each suction nozzle corresponds to a vacuum path and a switching element. To achieve micro-size switching array, a CMOS memory circuit and an address electrode array can be used.

Digital micro-mirror device (DMD) is a single chip semiconductor device with micro electro mechanical system (MEMS), which generally comprises area arrays of bistable state movable micro-mirror for forming image elements (pixel). The micro-mirror is fabricated in the area array corresponding to the addressing memory unit and placed above related address electrode at the bottom of the micro-mirror, wherein, the address electrode is under selective excitation by the control circuit to generate electrostatic attraction causing corresponding micro-mirror to deflect towards corresponding address electrode. The embodiments below, with the principle of DMD chip, a movable component of a micro-mirror similar to the DMD chip is set at the connection position of each vacuum path and the shared cavity, as a valve, and an associated address electrode is fabricated above the movable component, wherein, the address electrode is under selective excitation by the control circuit to generate electrostatic attraction causing corresponding movable component to deflect towards corresponding address electrode. In this way, the movable component skews or deflects to the address electrode to close or open the vacuum path, and controls each vacuum path valve via the switching component for controlling opening or closing of the vacuum path to extract required micro element.

Further, a space can be formed between the address electrode and the movable component with a sacrificial layer so that the movable component would deflect or approach to corresponding address electrode under electrostatic attraction.

Embodiment 1

Figure 1:
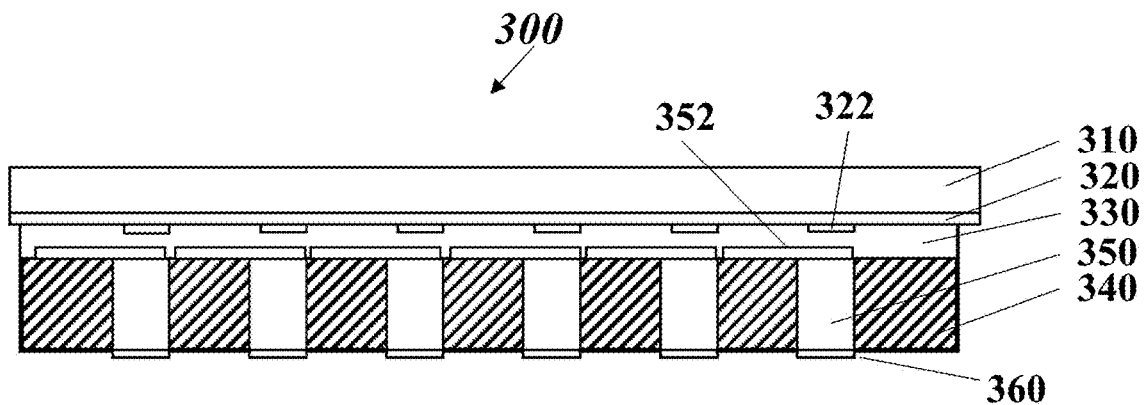
FIG. 1 illustrates a sectional view of a transfer head according to a first embodiment of the present disclosure.

FIG. 1 shows a first preferred embodiment of the present disclosure, a transfer head 300 for transferring the micro element includes: a cavity 330, a switching component array, a vacuum path array 350 and a suction nozzle array 360, wherein, the switching component array is arranged above the cavity 330, and the vacuum path array 350 is arrange below the cavity 330, and a space is between them to form a cavity. The vacuum path array is connected to the cavity 330; a valve 352 controls opening/closing of each vacuum path 350; and a switching component controls each vacuum path valve to open or close of the vacuum path so as to extract required micro element.

Figure 2:
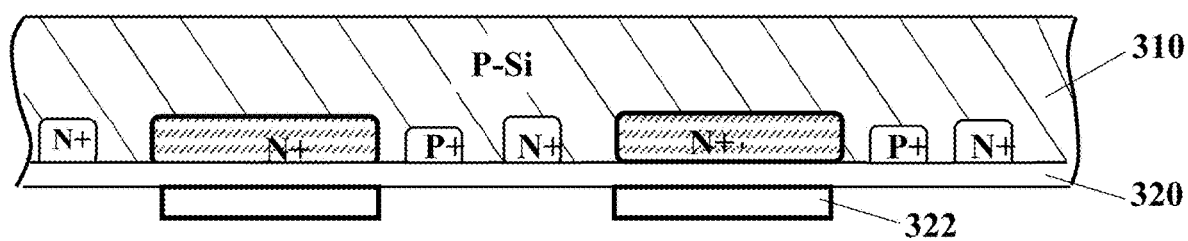
FIG. 2 illustrates a partial sectional view of the transfer head.

With reference to FIG. 2, the switching component array is composed of a CMOS memory circuit layer 310 and an address electrode layer 320 under the CMOS memory circuit layer, wherein, an address electrode array is arranged over the address electrode layer 320, and each address electrode 322 corresponds to a vacuum path 350.

Figure 3:
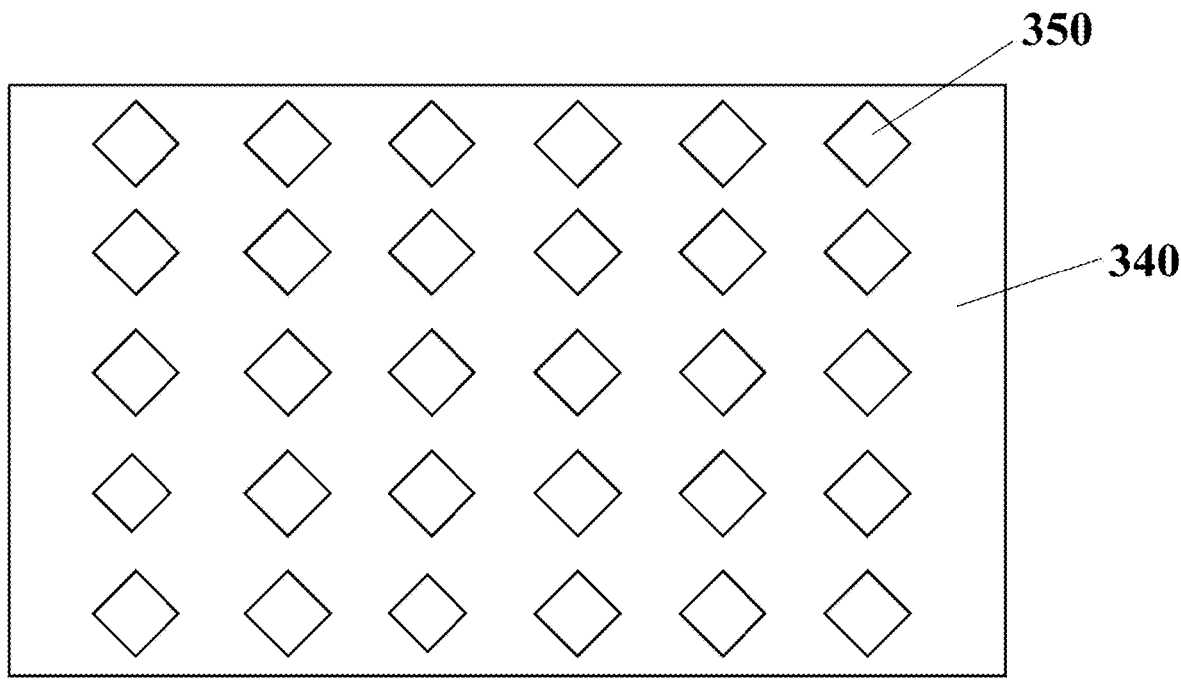
FIG. 3 illustrates a plan view of the vacuum path of the transfer head as shown in FIG. 1, wherein, the vacuum path is a micropore array arranged over the substrate.
Figure 4:
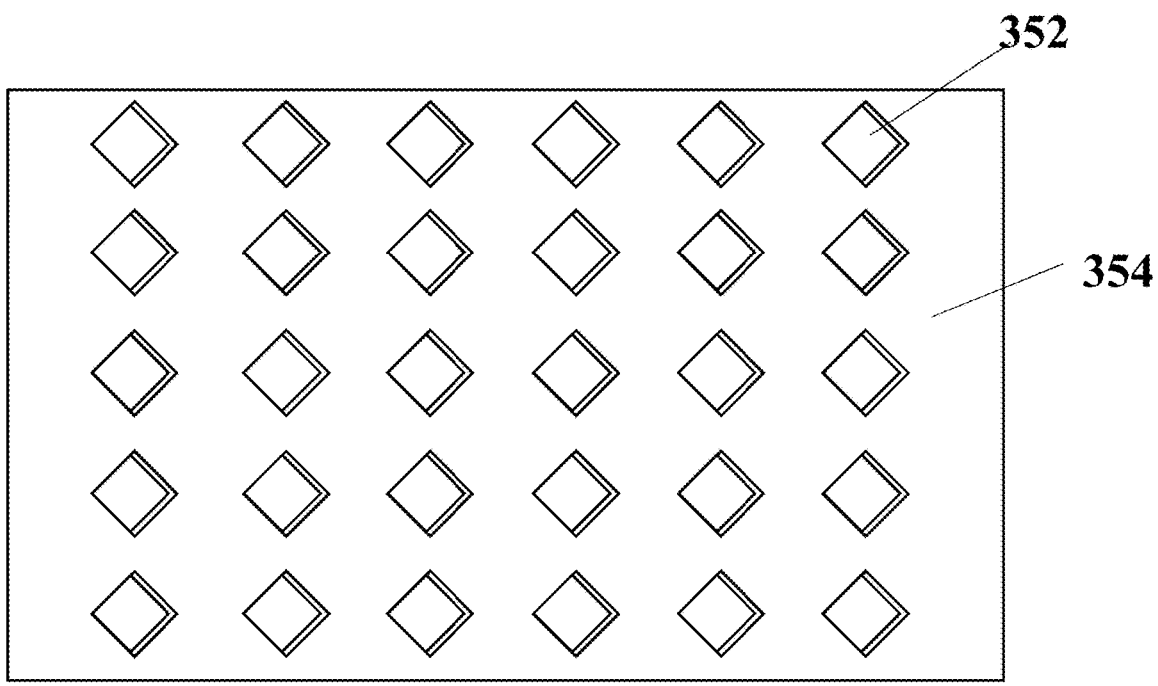
FIG. 4 illustrates a plan view of the valve on the micropore array as shown in the FIG. 3.
Figure 5:
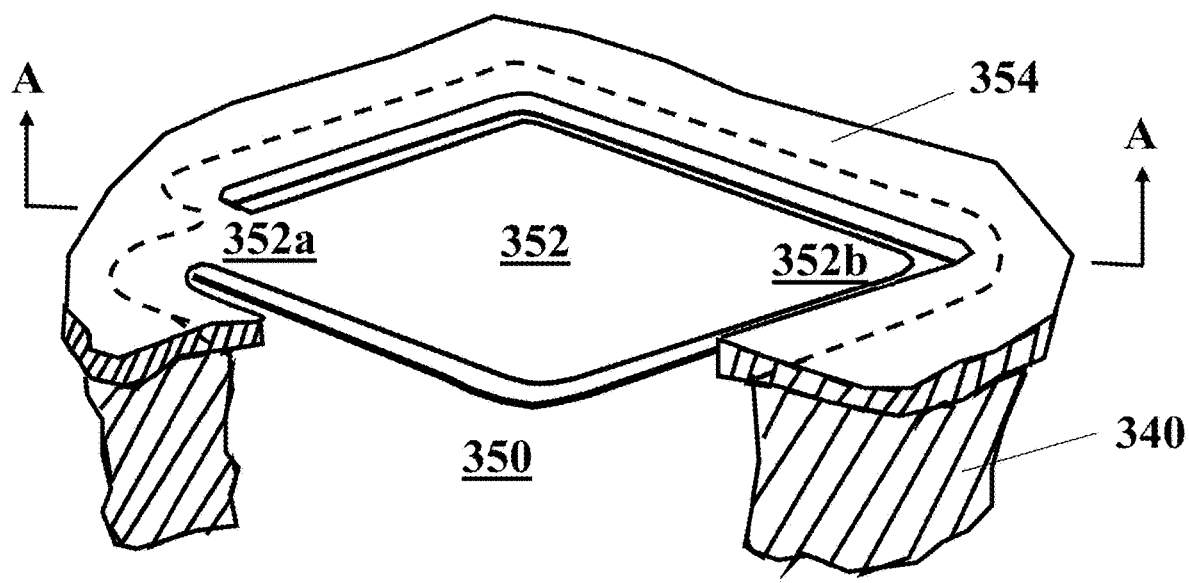
FIG. 5 shows a structural diagram of a single vacuum path.
Figure 6:
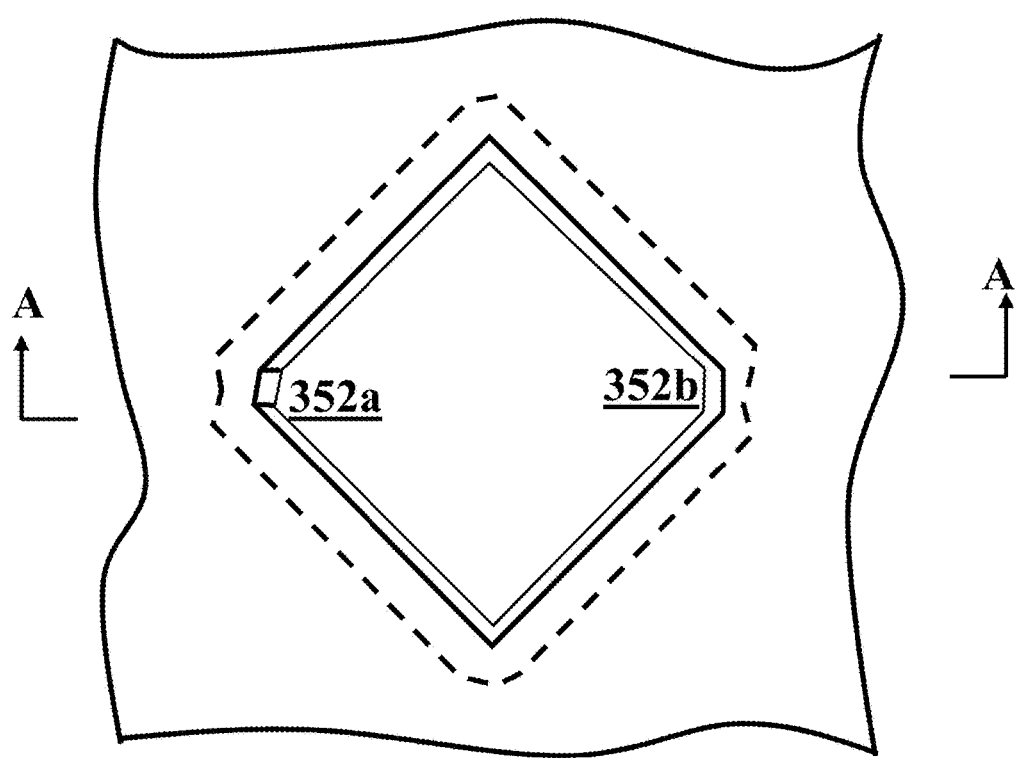
FIG. 6 shows a plan view of a single vacuum path.

With reference to FIG. 3, the vacuum path 350 is a micropore array formed over the substrate 340, wherein, the substrate 340 is under the cavity 330, which can be a Si substrate, a ceramic substrate, a metal substrate, a sapphire substrate or a semiconductor material substrate; and the micropore array or vacuum path 350 can be formed by laser boring, micro-perforation techniques (TSV) or wiring with size of 1 µm~100 µm, which is circular, oval, square, rectangle, triangle, trapezoid or regular polygon. In this embodiment, the micropore array is square with size of 10-20 µm. FIG. 4 is a plan view of the valve array 352 over the upper surface of the substrate 340, wherein, the valve array is a metal layer 354 formed over the surface of the substrate 340, which is separated via partial etching or cutting at the corresponding position of the micropore array, with at least one end is connected, as shown in FIG. 5. At the corresponding position of each micropore, at least one end 352a is connected to the metal layer 354, and for the metal sheet structure 352 not connected to the other end 352b, one end 352a, as the end, is connected to the metal layer 354, and the end 352b at the opposite angle of the end 352a can serve as a movable area to separate from the metal layer 354. In some embodiments, in the metal sheet 352, only one end 352a connection area is connected to the metal layer 354, and other non-connecting areas (i.e., areas except the connection part 352a, such as the end 352b opposite to the end 352a) have extremely small gap with the metal layer 354, with which, on the one hand, the metal sheet 352 can basically close corresponding micropore or vacuum path 350 when it is not deflected, and on the other end, causes upward deflection of the second end 352b of the metal sheet 352 under electrostatic attraction, so as to open corresponding micropore. FIG. 6 is a plan view of FIG. 5. In this embodiment, in general, the gap is below 1 µm or prefers to be under one tenth of the micropore size.

Figure 7:
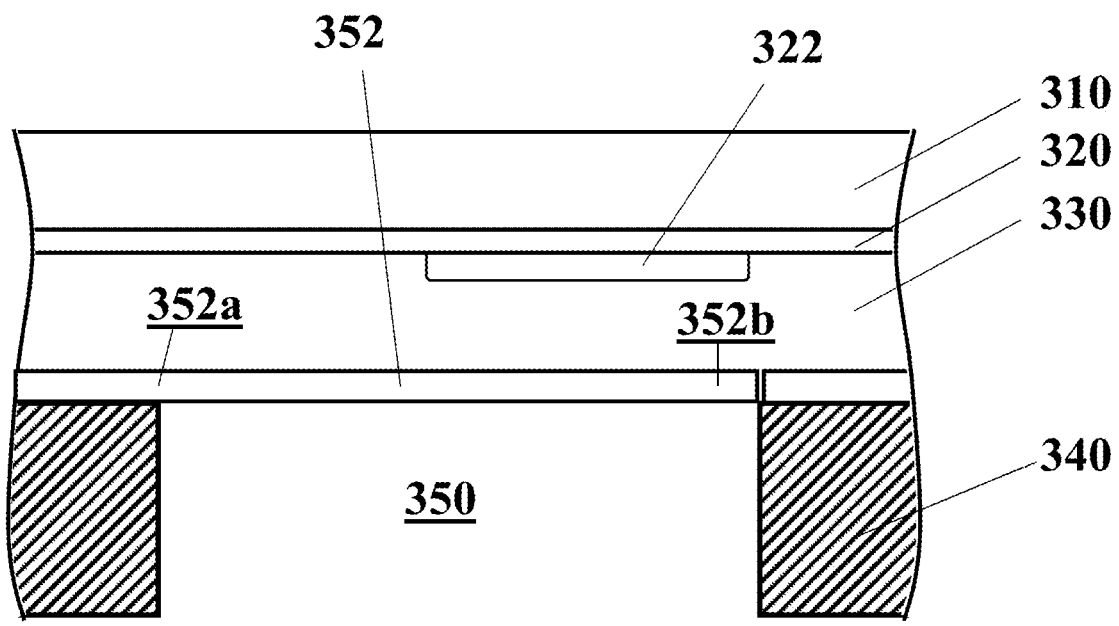
FIG. 7 shows a sectional view of a single transfer suction nozzle of the transfer head with a closing status of the vacuum path.
Figure 8:
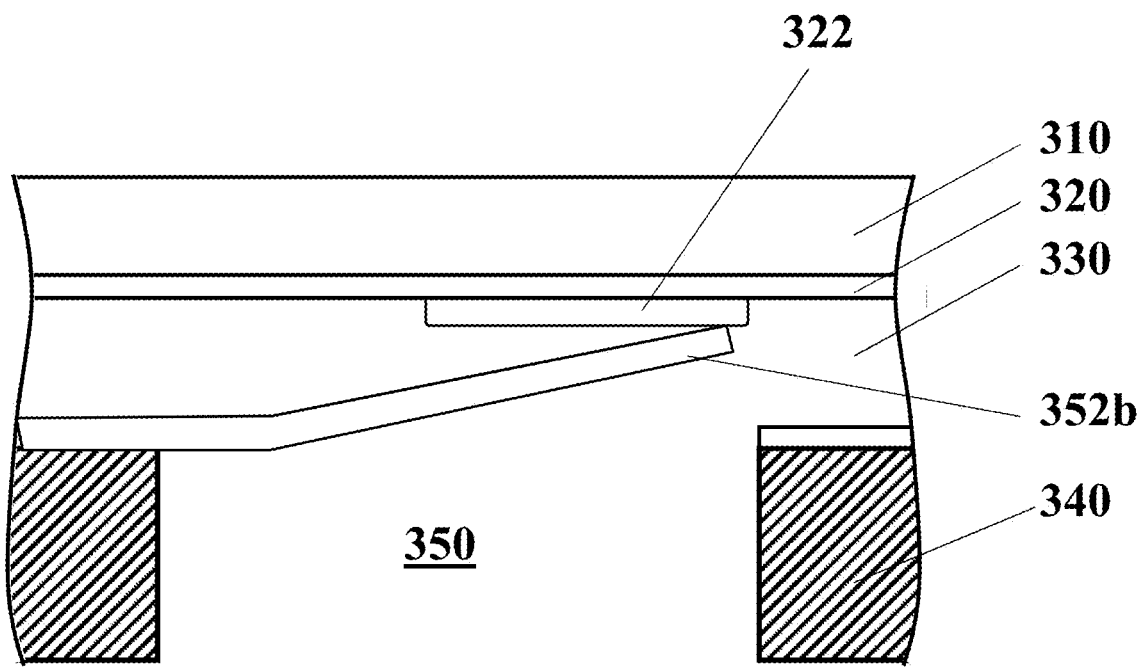
FIG. 8 shows opening status of the vacuum path.

FIGS. 7-8 are side section views of a single suction nozzle of the transfer head 300 along line A-A of FIG. 6. In this embodiment, there is gap between the metal sheet 352 and the address electrode 322 so that the metal sheet 352 can deflects toward the address electrode 322, and the address electrode 322 is arranged close to the second end 352b of the metal sheet 352. The CMOS memory circuit controls the ON/OFF status of the address electrode 322. When the address electrode 322 is in OFF status, the address electrode 322 is not excited with voltage potential so as not to generate electrostatic attraction, and the second end 352b of the metal sheet 352 is not deflected, which closes vacuum path 350, as shown in FIG. 7; when the address electrode 322 is in ON status, the address electrode 322 is excited with voltage potential to generate electrostatic attraction, so that the second end 352b of the metal sheet 352 deflects toward the address electrode 322 under electrostatic attraction of the address electrode 322, which opens the vacuum path 350, as shown in FIG. 8.

Embodiment 2

Figure 9:
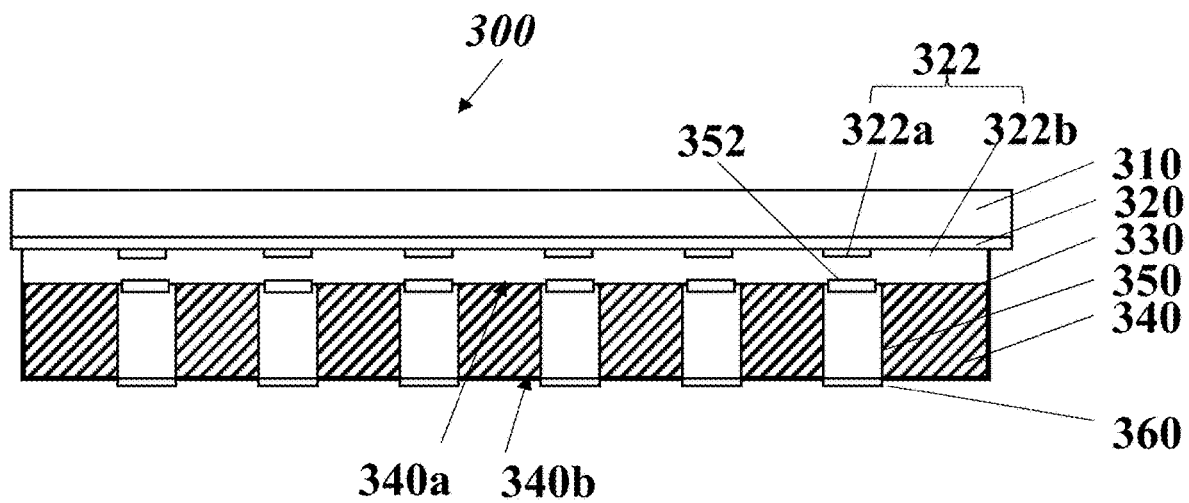
FIG. 9 illustrates a sectional view of a transfer head according to a second embodiment of the present disclosure.
Figure 10:
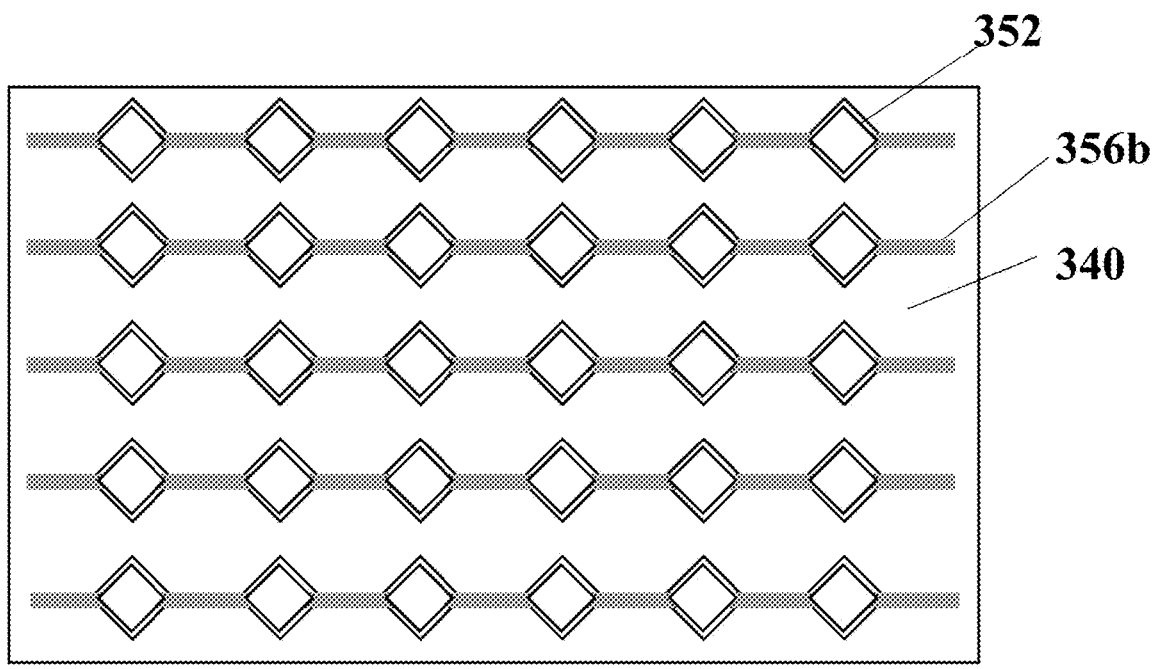
FIG. 10 illustrates a plan view of the valve arranged over the micropore array.

FIG. 9 shows a second preferred embodiment of the present disclosure, and the difference between this embodiment and the first embodiment is that: the valve 352 for controlling opening/closing of the vacuum path 350 is different. With reference to FIG. 10, in this embodiment, the valve is a component 352 capable for deflection at the micropore structure opening, wherein, the edge of this component is not connected to the micropore edge, but connects to the substrate 340 with a pivot 356b. The component 352, under electrostatic attraction of the address electrode 322, deflects taking the pivot as the center, wherein, one end 352b deflects towards the address electrode 322.

Figure 11:
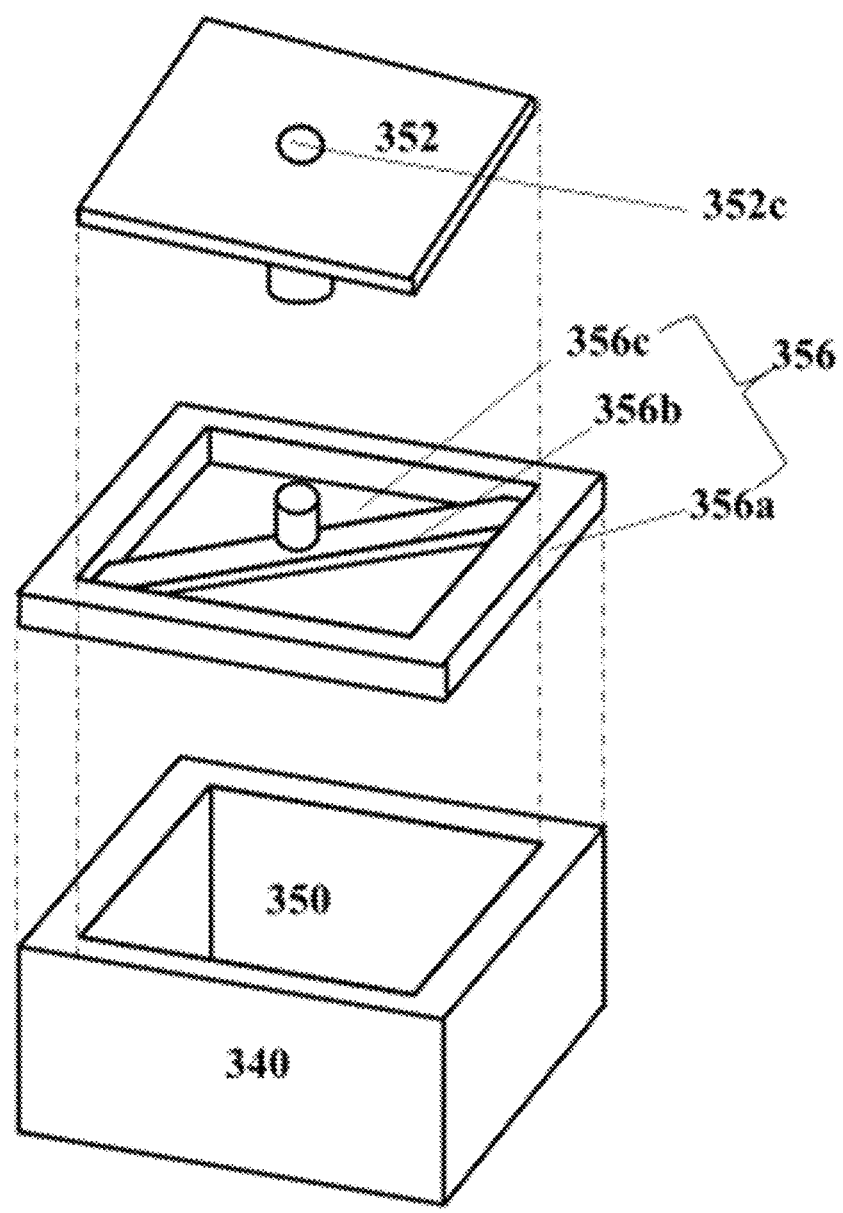
FIG. 11 illustrates an exploded view of the vacuum path of the transfer head of this embodiment.
Figure 12:
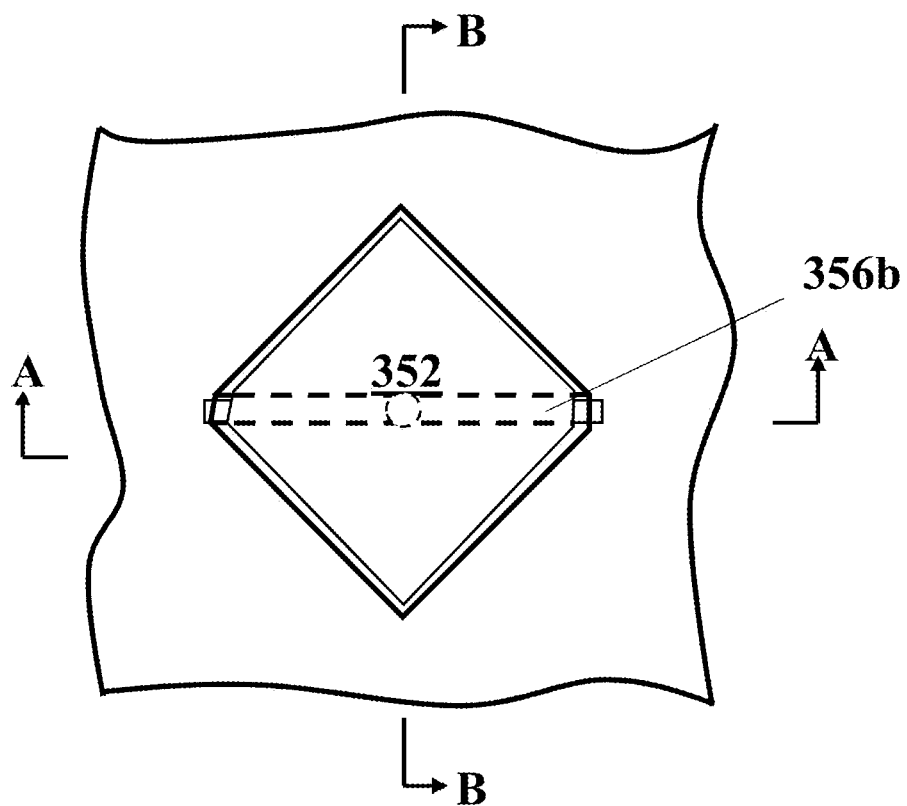
FIG. 12 illustrates a plan view of a vacuum path.

FIGS. 11 and 12 are structural exploded views and plan views of a single vacuum path 350, wherein, the vacuum path 350 includes a micropore over the substrate 340, a carrier layer 356 over the first surface of the substrate 340, and a movable component 352 over the carrier layer 356. Specifically, the carrier layer 356 includes a frame 356a, a pivot 356b and an opening 356c, wherein, the pivot 356b supports on the frame 356a and crosses the opening 356c. The movable component 352 supports on the pivot 356b via the hole 352, and can bias or deflect taking the pivot 356b as a center. The micropore or vacuum path 350, the opening 356c and the movable component 352 over the substrate 340 are corresponding structures, wherein, the shapes and sizes of the micropore or vacuum path 350 and the opening 356c are basically the same, and the movable component 352 prefers to be slightly smaller, which on the one hand, guarantees that the component 352 can basically close corresponding micropore or vacuum path 350 when it is not deflected, and on the other hand, can open corresponding micropore or vacuum path 350 when the component 352 deflects. Preferably, the pivot 356b is located at the diagonal of the opening 356c, and the upper surface is lower than the upper surface of the frame 356a; when the component 352 is installed on the pivot 356b and is not deflected, the upper surface is lower than or basically consistent with the upper surface of the frame 356a to ensure good closing performance when the movable component is closing the vacuum path. Of course, the pivot 356b can also be off-diagonal, but locate in the symmetry axis of the opening 356c, and the upper surface can be basically consistent with the upper surface of the frame 356a, i.e., the lower surface of the component 352 is not higher than the upper surface of the frame 356a.

Figure 13:
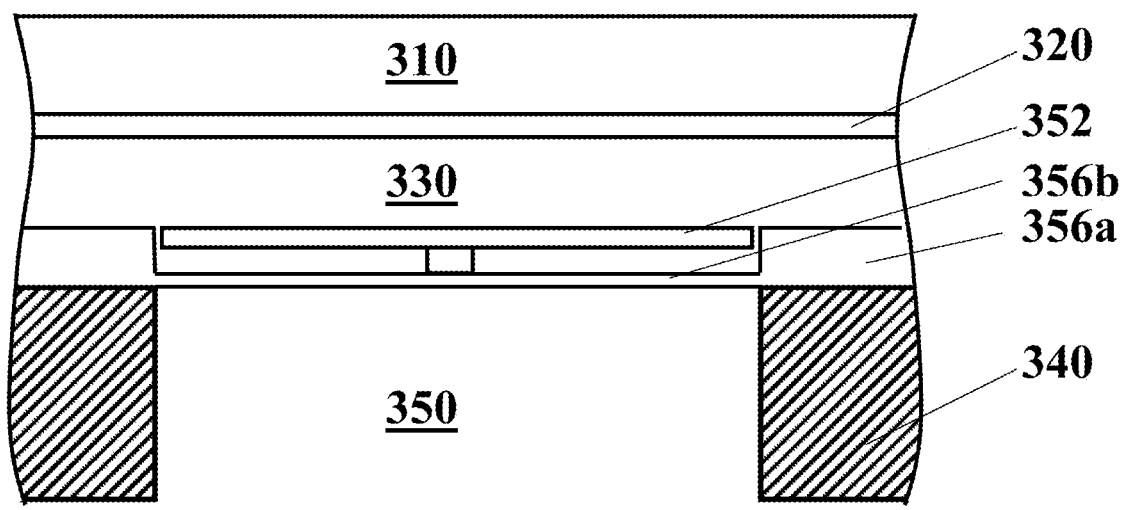
FIG. 13 illustrates a sectional view along line A-A of FIG. 12.
Figure 14:
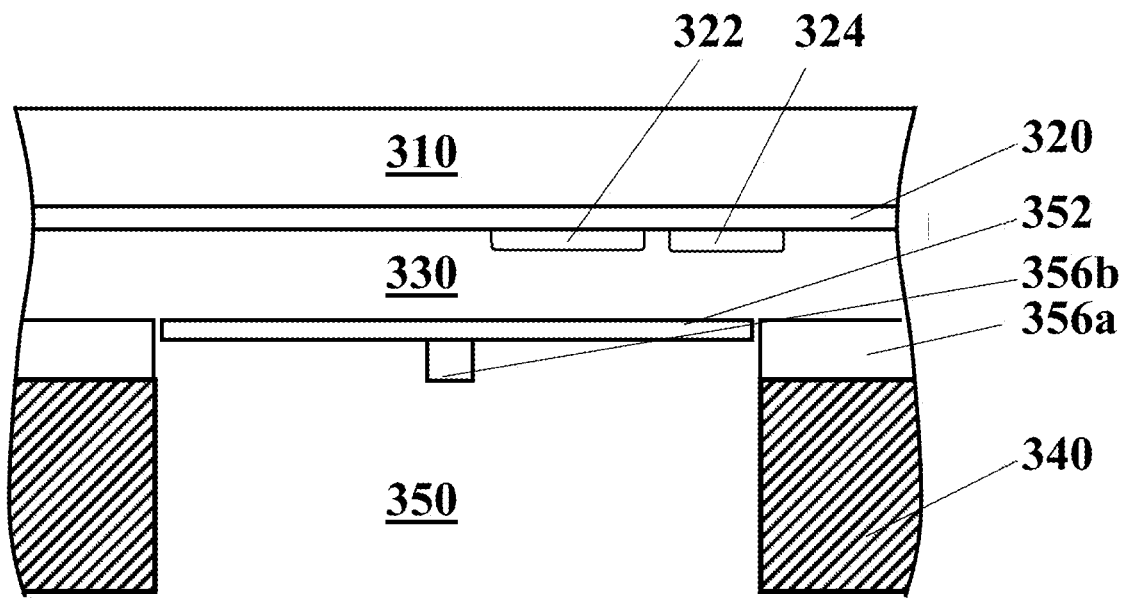
FIG. 14 illustrates a sectional view along line B-B of FIG. 12 with a closing status of the vacuum path.
Figure 15:
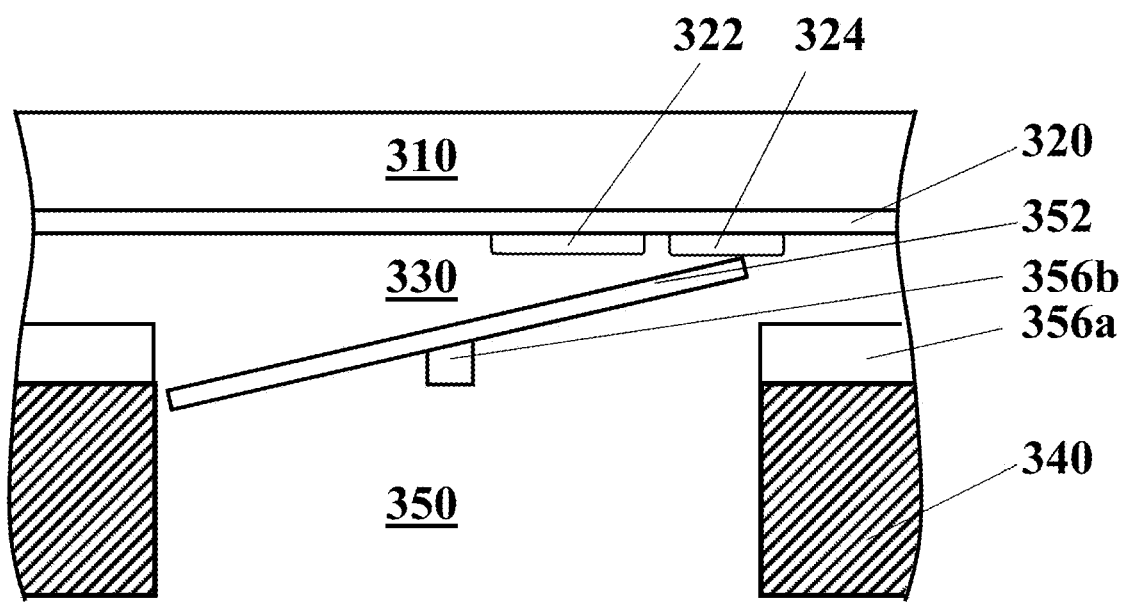
FIG. 15 shows an opening status of the vacuum path.

FIGS. 13-15 are sectional views of a single suction unit of the transfer head. FIG. 13 is a schematic diagram along line A-A of FIG. 12. As shown in the figure, in this embodiment, the upper surface of the pivot 356b is lower than the frame 356a, and the component 352 suspends on the pivot 356b. FIGS. 14-15 are schematic diagrams along line A-A of FIG. 12. As shown in the figure, an address electrode 322 is arranged above the component 352, wherein, the address electrode 322 is in the center of non-component. The CMOS memory circuit controls the ON/OFF status of the address electrode 322. When the address electrode 322 is in OFF status, the address electrode 322 is not excited with voltage potential so as not to generate electrostatic attraction, and the component 352 is not deflected, which closes the vacuum path 350, as shown in FIG. 14; when the address electrode 322 is in ON status, the address electrode 322 is excited with voltage potential to generate electrostatic attraction, so that the component edge turns on the pivot 356b and deflects towards the address electrode 322 under electrostatic attraction of the address electrode 322, which opens the vacuum path 350, as shown in FIG. 15.

In some embodiments, a landing pad 324 can be set at the outer side of the address electrode 322. Under ON status, when the component 352 turns, the edge contacts with the landing pad 324 to stop turning and keep deflection status, as shown in FIG. 15.

Embodiment 3

Figure 16:
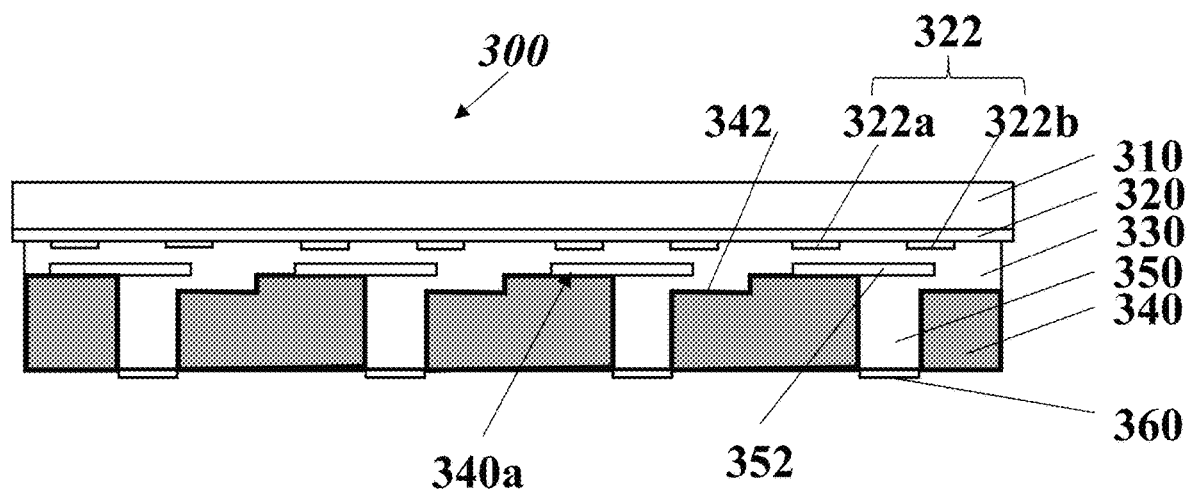
FIG. 16 illustrates a sectional view of the transfer head according to a third embodiment of the present disclosure.
Figure 17:
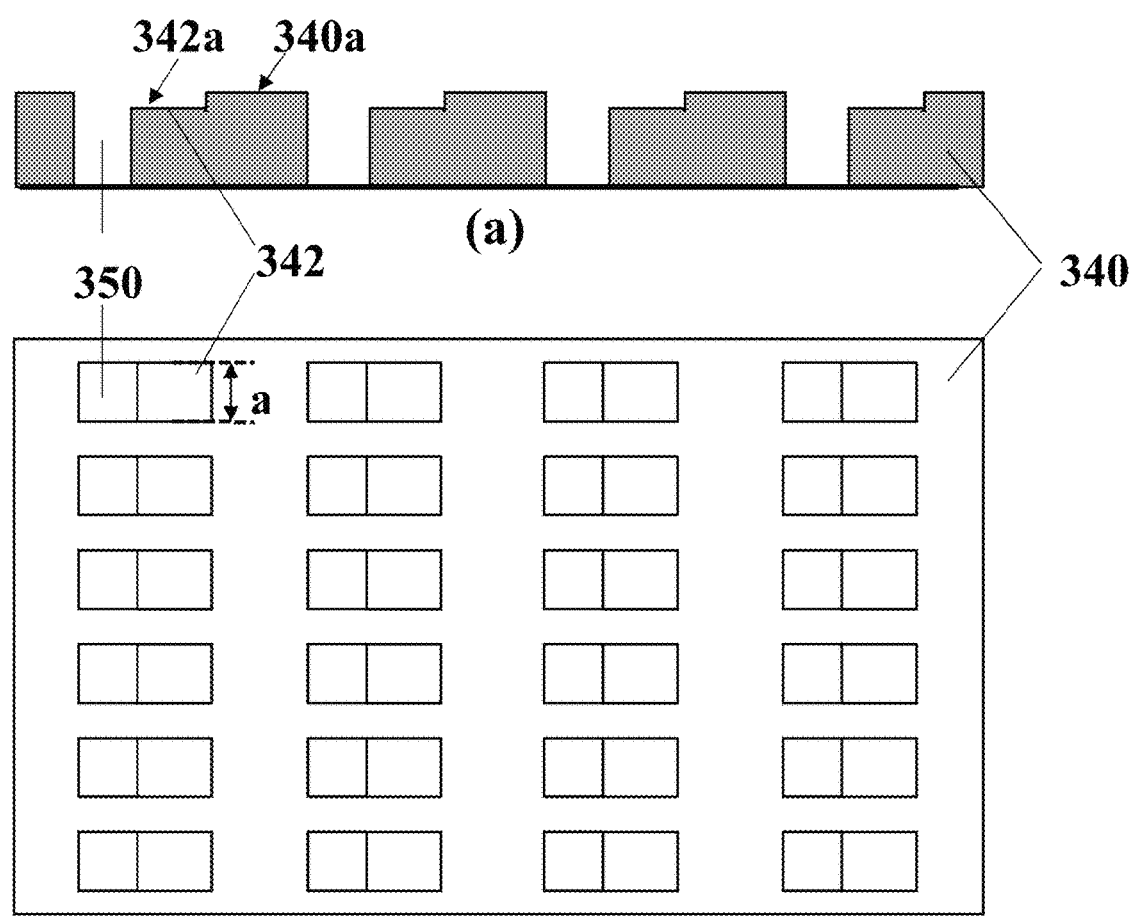
FIG. 17 illustrates a plan view of the vacuum path of the transfer head as shown in FIG. 16, wherein the vacuum path is a micropore array arranged over the substrate, and the connection position between the substrate and the micropore is a step-type.

FIG. 16 shows the third preferred embodiment of the present disclosure. In this embodiment, a step 342 is formed at the connection part of the first surface 340a of the substrate 340 and the micropore or vacuum path 350, wherein, the step surface 342a is lower than the first surface 340a of the substrate, and width a is equal to that of the micropore or vacuum path 350, as shown in FIG. 17.

Figure 18:
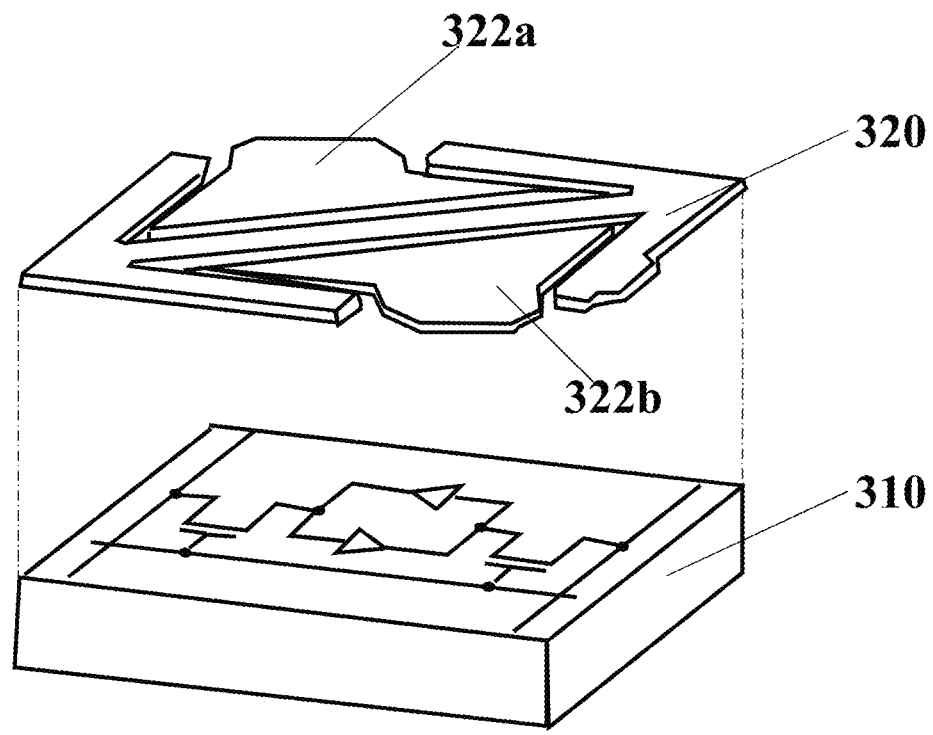
FIG. 18 illustrates an exploded view of the switching component of the transfer head as shown in FIG. 17.
Figure 19:
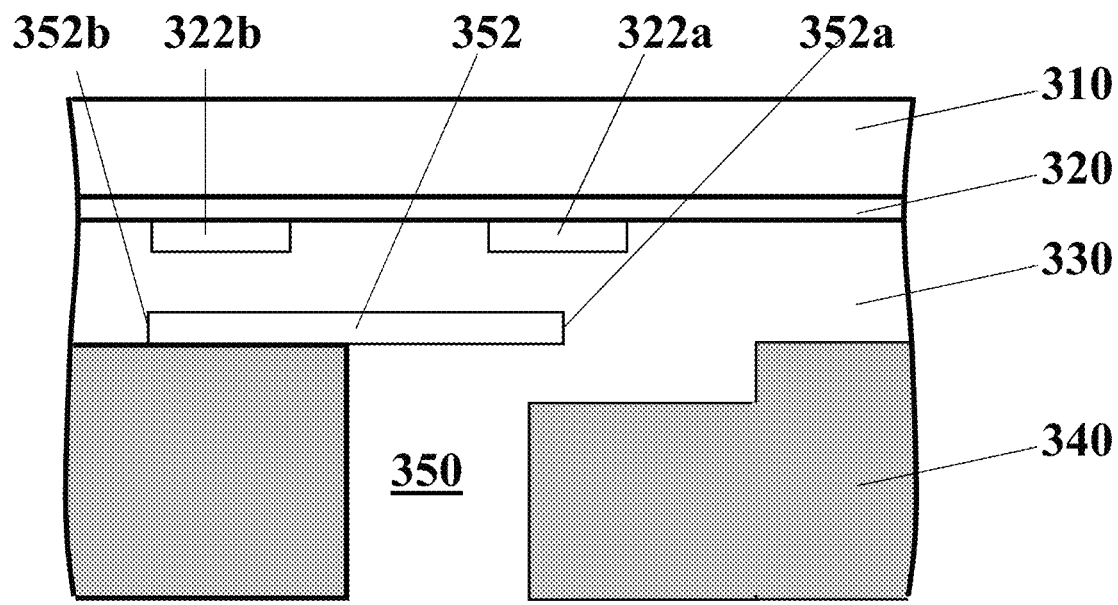
FIG. 19 illustrates a sectional view of a single suction nozzle of the transfer head with a non-power-on status.

FIG. 18 is an exploded view of a single switching component, wherein, the switching component is composed of a CMOS memory circuit layer 310 and an address electrode layer 320 under the CMOS memory circuit layer; an address electrode array is arranged over the address electrode layer 320, and each group of address electrodes includes a pair of first electrode 322a and second electrode 322b isolated from each other, which correspond to a vacuum path 350. Details are given below with combination of FIGS. 19-21. In this embodiment, the movable component 352 is formed over the first surface 340a of the substrate 340, and crosses the micropore or vacuum path 350, wherein, one end 352a is at corresponding position of the step 342. The movable component 352 can be a rectangle metal sheet, with width same as that of the micropore or vacuum path 350 and length larger than that of the micropore or vacuum path 350. The first end 352a of the metal sheet 352 is above the step and is suspended; and the second end 352b is over the first surface 340a of the substrate. Each metal sheet corresponds to a micropore and a pair of address electrodes 322, wherein, the first end of the metal sheet 352 is located below the address electrode 322a, and the second end of the metal sheet 352 is located below the address electrode 322b.

Figure 20:
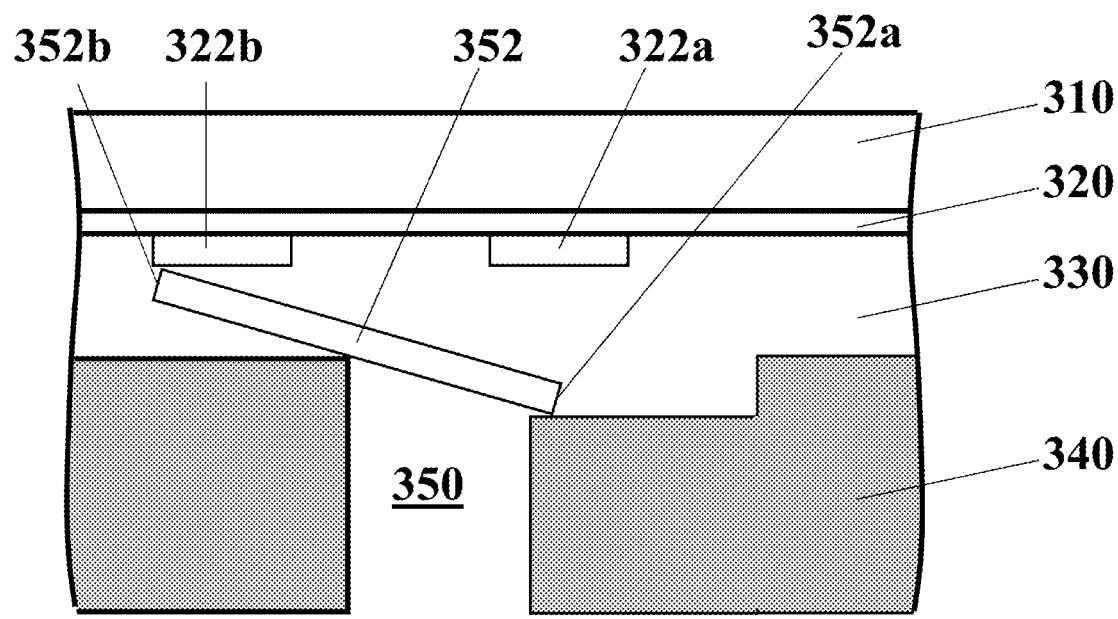
FIG. 20 shows a closing status of the vacuum path.
Figure 21:
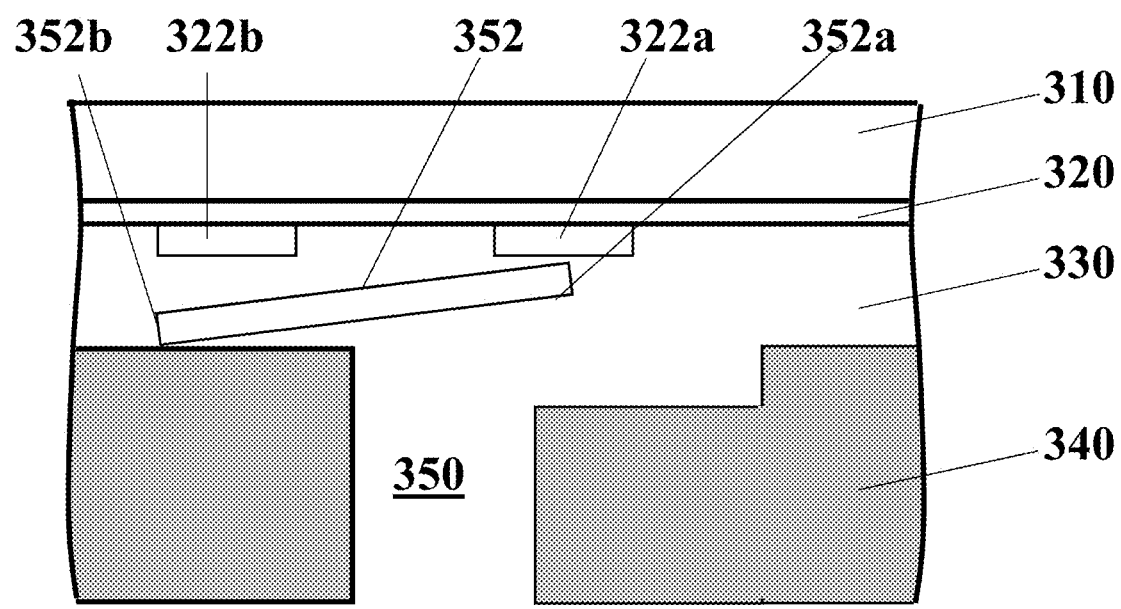
FIG. 21 shows opening status of the vacuum path.

The CMOS memory circuit 310 controls the ON/OFF status of the address electrode 322. When the address electrode 322a is in OFF status, and the address electrode 322b is in ON status, the address electrode 322b is excited with voltage potential to generate electrostatic attraction, so that the second end 352b of the metal sheet 352 deflects towards the address electrode 322b under electrostatic attraction of the address electrode 322b, which closes the vacuum path 350, as shown in FIG. 20; when the address electrode 322a is in ON status and the address electrode 322b is in OFF status, the address electrode 322a is excited with voltage potential to generate electrostatic attraction, so that the first end 352a of the metal sheet 352 deflects towards the address electrode 322a under electrostatic attraction of the address electrode 322a, which opens the vacuum path 350, as shown in FIG. 21.

Figure 22:
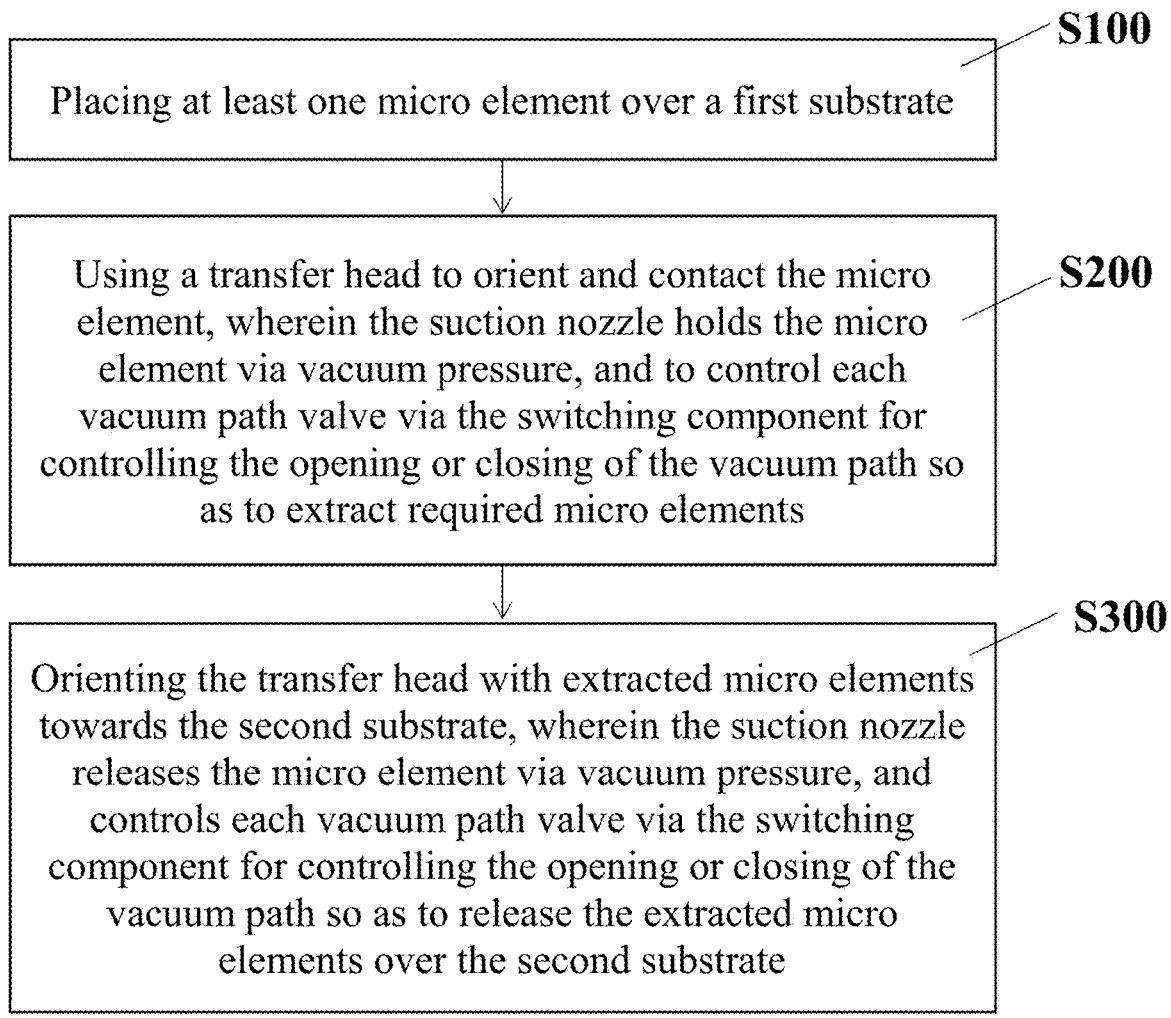
FIG. 22 shows a flow diagram of the transfer method of the micro element according to the present disclosure.

FIG. 22 shows a transferring method for the micro element, mainly including process steps S100: placing at least one micro element over a first substrate; S200: using a transfer head to orient and contact the micro element, wherein the suction nozzle holds the micro element via vacuum pressure, and to control each vacuum path valve via the switching component for controlling the opening or closing of the vacuum path so as to extract required micro elements; and S300: orienting the transfer head with extracted micro elements towards the second substrate, wherein the suction nozzle releases the micro element via vacuum pressure, and controls each vacuum path valve via the switching component for controlling the opening or closing of the vacuum path so as to release the extracted micro elements over the second substrate. Details will be given in combination with FIGS. 23-27.

Figure 23:
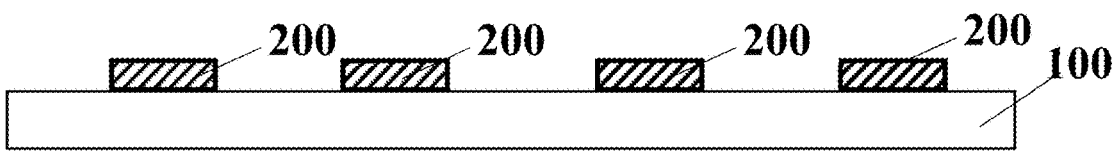
FIG. 23 illustrates a first step in a method of transferring a micro element: placing at least one micro element over a first substrate.

As shown in FIG. 23, provide a first substrate 100, which can be a growth substrate or a carrier substrate. In this embodiment, a carrier substrate is preferred, which can be glass, silicon, polycarbonate, acrylonitrile butadiene styrene or any of their combinations. It should be noted that specific embodiments of the carrier substrate aforesaid are only for illustration, and shall not be deemed as a limitation of the present disclosure. The person having ordinary skill in the art shall select specific embodiments of the first substrate 100 based on actual requirements. Arrange a plurality of micro element arrays 200 over the first substrate 100, wherein, the micro element can be a wafer before wafer processing technology, a light-emitting diode or a laser diode. In this embodiment, the micro element prefers to be a thin light-emitting diode with thickness of about 0.5 μm to about 100 μm. The micro element 200 can be a cylinder with radius of about 0.5 μm to about 500 μm. However, the micro element 200 is not limited to cylinder, but can be triangular column, cube, rectangular, hexagonal column, octagonal column or other polygonal cylinders.

Figure 24:
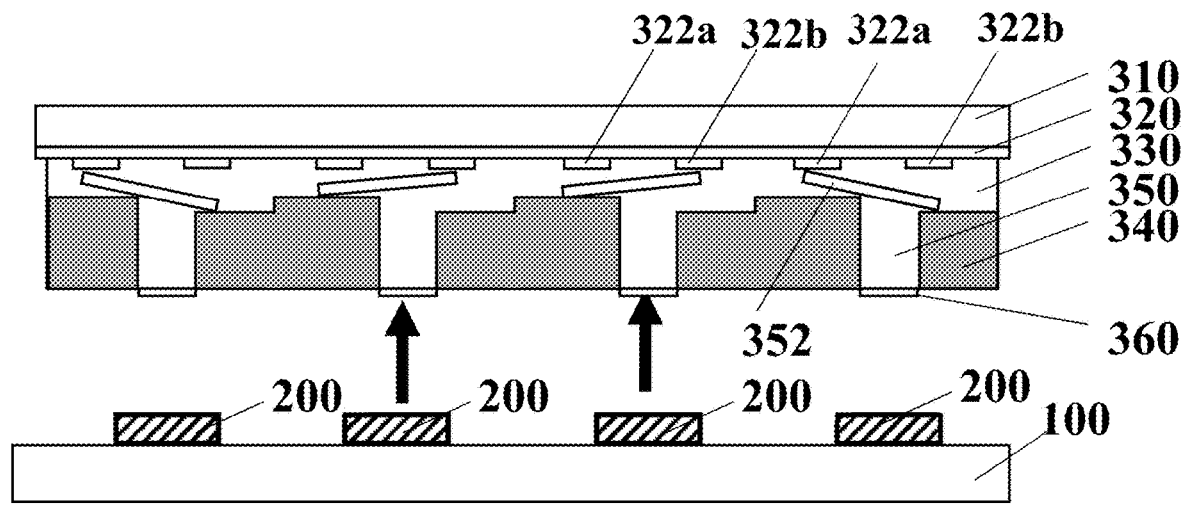
FIG. 24 illustrates a second step in transferring the micro element: using a transfer head to orient and contact the micro element.
Figure 25:
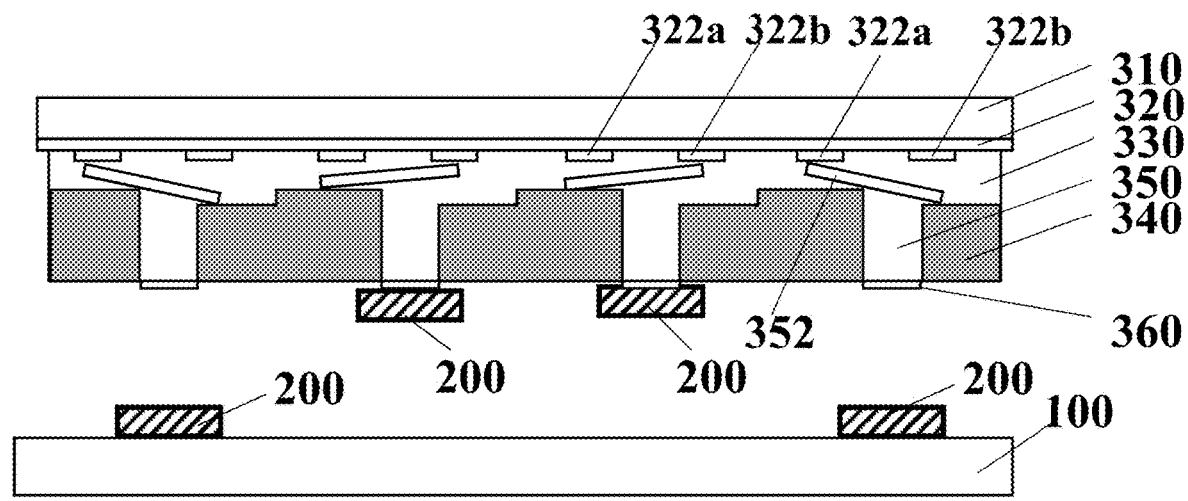
FIG. 25 illustrates a third step in transferring micro element: suction nozzles hold micro elements via vacuum pressure.

As shown in FIGS. 24 and 25, provide a transfer head 300, which orients towards and contacts the micro element 200 over the first substrate 100, wherein, the transfer head 300 can be any of the aforesaid structure. In this embodiment, brief description will be given taking the transfer head as shown in FIG. 16 as an example. As shown above, the transfer head 300 orients and contacts the micro element 200 over the first substrate 100, wherein, the suction nozzle holds the micro element via vacuum pressure, and controls opening or closing of the vacuum path of each path to extract required micro element.

Figure 26:
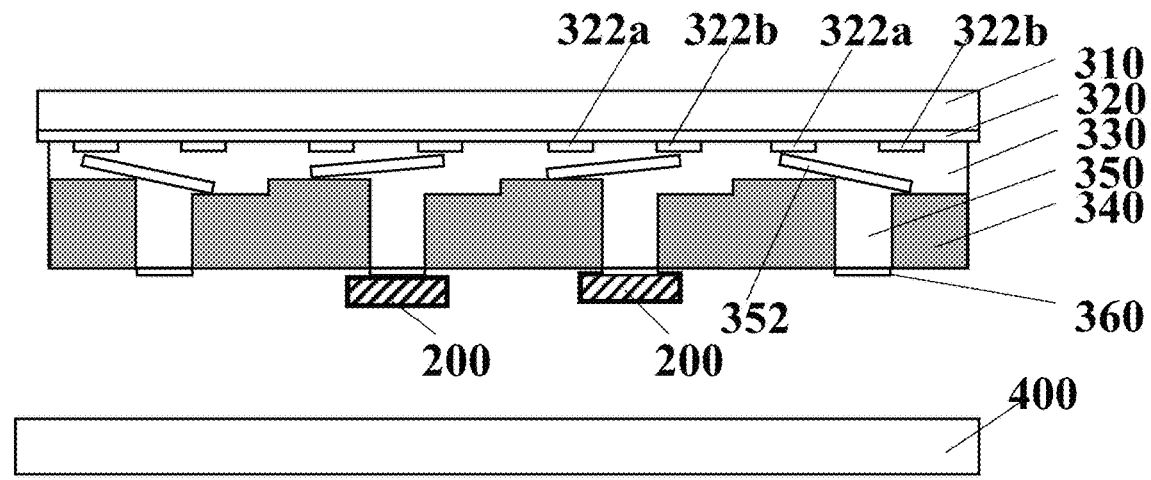
FIG. 26 illustrates a fourth step in transferring micro element: orienting the transfer head with extracted micro element towards the second substrate.
Figure 27:
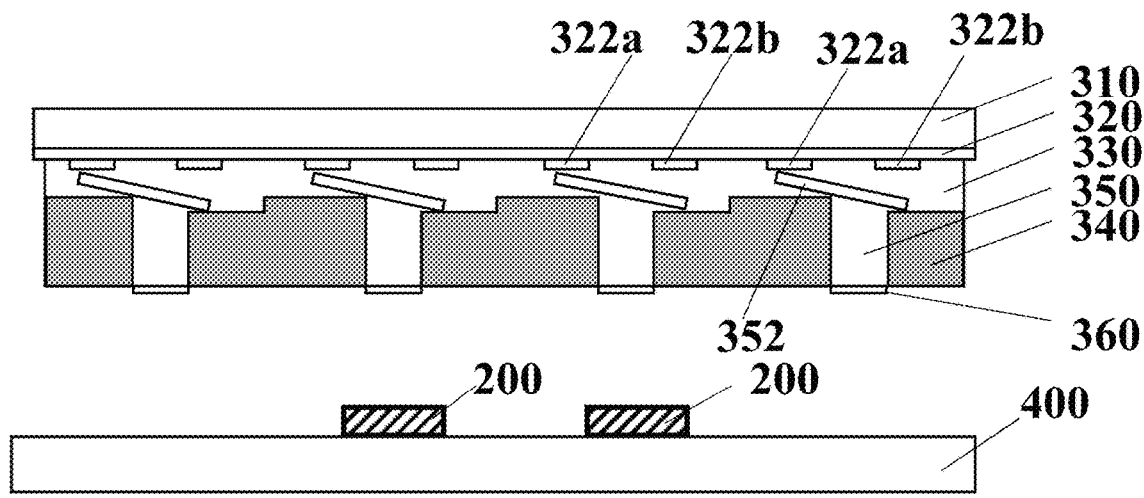
FIG. 27 illustrates a fifth step in transferring micro element: the suction nozzle releases the micro element via vacuum pressure over the second substrate.

As shown in FIGS. 26 and 27, provide a second substrate 400, wherein the transfer head 300 orients the second substrate 400. The second substrate, as an acceptor substrate, can be automotive glass, glass sheet, flexible electronic substrate, such as flexible film of circuit, display back plate, solar glass, metal, polymer, polymer compound and glass fiber. The suction nozzle 360 releases the micro element 200 via vacuum pressure, and controls opening or closing of each vacuum path with the switching component, to release required micro element over the second substrate 400.

The second substrate 400 can be an active element array substrate or a passive element array substrate. In this embodiment, an active element array substrate is preferred. Therefore, the second substrate 400 and the micro element 200 would form an active display panel or other devices. The second substrate 400 and the micro element 200 can also form a light-emitting device.

It should be noted that the micro element can be fully extracted at one time or partially extracted. Further, extract partial qualified micro elements for transferring and leave unqualified micro elements; or extract unqualified micro elements and leave qualified micro elements over the first substrate so as to improve efficiency and yield of the microelement transferring.

The transferring method for the micro element according to this embodiment can also be used for fabricating electronic device, or be widely applied in electronic devices like mobile phone, tablet PC, etc.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A transfer head for transferring micro elements, comprising:
 a cavity;
 a plurality of vacuum paths connected with the cavity respectively and including valves for opening or closing;
 a plurality of suction nozzles connected with the vacuum paths configured to hold or release the micro elements via vacuum pressure transmitted by each vacuum path; and
 a switching component for controlling the valves to open or close the vacuum paths, so as to control the suction nozzles to hold or release required micro elements via vacuum pressure;
 wherein the switching component comprises a CMOS memory circuit and an address electrode array connected to the CMOS memory circuit, wherein, each vacuum path valve corresponds to an address electrode in the array.

2. The transfer head of claim 1, wherein the valve is a movable component; the address electrode array is under selective excitation by the CMOS memory circuit with voltage potential to generate electrostatic attraction, through which, corresponding movable component can deflect or approach to corresponding address electrode, thus controlling the opening or closing of each vacuum path.

3. The transfer head of claim 2, wherein the movable components are under the address electrode array, and are separated from each other; a space is between them so that the movable component can deflect or approach to corresponding address electrode under electrostatic attraction.

4. The transfer head of claim 3, wherein a space is formed between the address electrode and the movable component with a sacrificial layer so that the movable component can deflect or approach to corresponding address electrode under electrostatic attraction.

5. The transfer head of claim 2, further comprising a substrate with two opposite surfaces, wherein, the first surface is proximal to the cavity, and the second surface is distal from the cavity; the vacuum paths are a series of micropores passing through the substrate, wherein, one end is connected to the cavity, and the other end is connected to the suction nozzles.

6. The transfer head of claim 5, wherein a connection part between the first surface of the substrate and the micropore has a third surface lower than the first surface; the movable component is arranged over the first surface of the substrate, and crosses the micropore structure, wherein one end is in a corresponding position over the third surface of the substrate and is suspended, so that another end of the movable component can deflect towards the address electrode under electrostatic attraction to close or open corresponding vacuum path.

7. The transfer head of claim 6, wherein the connection position between the first surface of the substrate and the micropore has a step; the step surface is lower than the first surface; and the step has a same width as that of the micropore.

8. The transfer head of claim 5, wherein the movable component is arranged over the first surface of the substrate, wherein, at least one end is fixed on the first surface of the substrate, and extends towards the micropore to cover the opening of the micropore structure, and another end of the movable component deflects towards the address electrode under electrostatic attraction.

9. The transfer head of claim 8, wherein the first surface of the substrate is provided with a metal layer, and is fabricated to make a metal sheet structure as the movable component at corresponding position of the micropore of the substrate; at least one end of the metal sheet is connected to the metal layer, and the other end is separated from the metal layer, which can deflect towards the address electrode under electrostatic attraction.

10. The transfer head of claim 8, wherein a first end of the movable component is fixed on the first surface of the substrate, and a diagonal second end of the movable component is under a corresponding address electrode, and can deflect towards the address electrode under electrostatic attraction.

11. The transfer of claim 8, wherein the movable component is fixed over the first surface of the substrate via a pivotal structure, and deflects towards a corresponding address electrode under electrostatic attraction taking this pivot as the center.

12. The transfer head of claim 5, wherein the substrate is a Si substrate, a ceramic substrate, a metal substrate, a sapphire substrate or a semiconductor material substrate.

13. The transfer head of claim 5, wherein the suction nozzles have a size below 100 μm.

14. The transfer head of claim 5, wherein the micropore structure is formed by laser boring, micro-perforation techniques, or wiring.

15. The transfer head of claim 5, wherein the suction nozzles are distributed in an array, wherein a space between suction nozzles is below 200 μm.

16. A transfer method for transferring micro elements, the method comprising:
   (1) placing at least one micro element over a first substrate;
   (2) using a transfer head of to orient and contact the micro element, wherein:
      the transfer head comprises:
         a cavity;
         a plurality of vacuum paths connected with the cavity respectively and including valves for opening or closing;
         a plurality of suction nozzles connected with the vacuum paths configured to hold or release the micro elements via vacuum pressure transmitted by each vacuum path; and
      a switching component for controlling the valves to open or close the vacuum paths, so as to control the suction nozzles to hold or release required micro elements via vacuum pressure;
      the suction nozzle holds the micro element via vacuum pressure, and controls each vacuum path valve via the switching component for controlling the opening or closing of the vacuum path so as to extract required micro element; and
   (3) orienting the transfer head with extracted micro element towards the second substrate, wherein, the suction nozzle releases the micro element via vacuum pressure, and controls each vacuum path valve via the switching component for controlling the opening or closing of the vacuum path so as to release the extracted micro element over the second substrate.

17. The transfer method of claim 16, wherein:
a plurality of micro elements are provided;
in step (2), only a portion of the micro elements are held to extract required micro elements; and
in step (3), only a portion of the micro elements are desorbed to release required micro elements.

18. The transfer method of claim 16, wherein the first substrate is a growth substrate, or a carrier substrate.

19. The transfer method of claim 16, wherein the second substrate is an active element array substrate, or a passive element array substrate.

* * * * *